United States Patent
Reddy et al.

(10) Patent No.: US 6,339,364 B1
(45) Date of Patent: Jan. 15, 2002

(54) RF CHOKE WITH WINDINGS SEPARATED BY A DISTANCE EQUAL TO THE SMALLER CORE DIAMETER

(75) Inventors: Prabhakara Reddy, The Woodlands; George W. DuBois, Conroe, both of TX (US)

(73) Assignee: National Electronic Devices Ltd., Conroe, TX (US)

(*) Notice: Subject to any disclaimer, the term of this patent is extended or adjusted under 35 U.S.C. 154(b) by 0 days.

(21) Appl. No.: 09/333,623

(22) Filed: Jun. 15, 1999

Related U.S. Application Data (63) Continuation-in-part of application No. 09/193,893, filed on Nov. 18, 1998, now Pat. No. 6,094,110.

(51) Int. Cl.[7] .................................................. H03H 7/06
(52) U.S. Cl. ........................ 333/181; 333/172; 333/185; 336/212; 336/180
(58) Field of Search ................................ 333/167, 181, 333/185, 172; 336/212, 180, 211

(56) References Cited

U.S. PATENT DOCUMENTS

| | | |
|---|---|---|
| 2,591,081 A | 4/1952 | Lyman et al. |
| 4,128,818 A | 12/1978 | Scherba |
| 4,236,127 A | 11/1980 | Scherba |
| 4,641,115 A | 2/1987 | Bailey |
| 5,032,808 A | 7/1991 | Reddy |
| 5,091,707 A | 2/1992 | Wollmerschauser et al. |
| 5,179,334 A | 1/1993 | Reddick |
| 5,483,208 A | 1/1996 | Spriester |
| 5,767,759 A | * 6/1998 | Rouet ...................... 336/212 X |

FOREIGN PATENT DOCUMENTS

| | | | |
|---|---|---|---|
| EP | 0848391 | * 6/1998 | .................. 333/185 |

* cited by examiner

*Primary Examiner*—Justin P. Bettendorf
(74) *Attorney, Agent, or Firm*—Wall Marjama & Bilinski LLP (57) ABSTRACT

A radio frequency (RF) choke having improved insertion loss and reduced modulation hum. The choke includes a core having first and second end portions which have similar magnetization and saturation characteristics, and which may be of equal or unequal diameters. A plurality of turns of a first conductor encircle the first end portion of the core in a first direction to define a first winding. Pluralities of turns of a second conductor encircle the second end portion of the core in the opposite direction to define second and third windings. The numbers and spacings of the turns of the first winding are so related to the numbers and spacings of the turns of the second and third windings that relatively low frequency currents flowing through said windings generate substantially canceling fluxes in the first and second end portions of the core, while relatively high frequency currents flowing through said windings do not generate substantially canceling fluxes in the first and second end portions of the core. The windings associated with the first and second end portions of the core, and/or the end portions of the core may be separated by predetermined respective distances, thereby improving the ability of the choke to discriminate between high and low frequency currents.

20 Claims, 6 Drawing Sheets

RF CHOKE WITH WINDINGS SEPARATED BY A DISTANCE EQUAL TO THE SMALLER CORE DIAMETER

CROSS REFERENCES TO RELATED APPLICATIONS

The present application is a continuation-in-part of U.S. patent application Ser. No. 09/193,893, filed Nov. 18, 1998 now U.S. Pat. No. 6,094,110.

FIELD OF THE INVENTION

This invention relates generally to a radio frequency (RF) choke, and more specifically concerns a choke for separating an AC power wave from a broadband signal, where both are carried on the same conductors.

BACKGROUND OF THE INVENTION

It is common in CATV distribution systems to use a broadband signal (e.g. 50 to 1000 MHZ) to carry the various channels and other information to the subscribers, another broadband signal (e.g. 5 to 40 MHZ) to carry information from the subscribers to the cable distribution station, and 60 Hz single phase power to operate amplifiers and other devices located at various points on the cable system. In such systems, the broadband signals and AC power are typically each carried on the same transmission line, e.g., the center conductor and braid of a coaxial cable.

Each of the broadband signals originate from a central location. The coaxial cables used to carry these signals inherently have loss characteristics. Thus, amplifier stations must be installed at appropriate locations along the cable in order to compensate for the losses and deliver faithful broadband ("RF") signals. The single phase AC power signal is needed to operate the amplifier stations.

The power signal is passed along the cable concurrently with the RF signal. The power level of the AC signal is much greater than that of the RF signal, and uses different and separate circuitry to operate the amplifier station. Therefore, the AC power signal must be separated from the RF signal at each of the amplifier stations.

It is common practice to use an RF choke and a capacitor to separate the single-phase AC power signal from the broadband RF signals at points along the cable where the RF signal is to be processed in an RF device. After passing the device, the AC power is recombined with the broadband signal, requiring the use of a second RF choke.

The AC power has a current magnitude up to 15 amperes at 60 volts. On the other hand, the broadband RF signal has a low peak voltage of about 0.3 volts. When isolating the AC power from an RF device, the chokes must prevent the RF broadband signal from passing through the choke along the AC power path in order to avoid a significant loss of signal.

One choke, developed by the present inventor which solves many of the problems in the art, is described in U.S. Pat. No. 5,032,808 which is incorporated herein by reference. The choke described in the '808 patent comprises a series of three sets of windings, each of which has a distinct number turns wound upon a core having a uniform cross sectional area along its entire length. The first set of windings is connected at one end to an input lead and at an opposite end to the second set of windings through an air coil inductor. The second set of windings is similarly connected to one end of a third set of windings by means of a second air coil inductor. The output end of the third set of windings in turn is connected to an output lead.

A commercial RF choke is typically constituted by a number of turns of insulated copper wire wound upon a ferrite coil form. A resistor can be connected in parallel with a portion of this wire coil, e.g., from a preselected turn to one of the lead wires, to serve as a shunt. This parallel resistor is selected so that it does not significantly reduce the impedance of the RF choke. There is an effective capacitance between turns of the wire coil, which produces a self-capacitance that combines with the coil inductance to produce an LC resonance. Typically, such resonances unfortunately often lie within the band of the broadband RF signal. The effect of the shunt resistance is to reduce the Q of the LC resonance, thereby blunting the sharpness of any in-band resonances.

A reduction in the number of turns of the wire coil can push any LC resonances above the passband, but this reduction will also result in a reduction in inductance, limiting the suitability of the choke at the 5 MHZ low end of the band. The presence of the shunt resistor in the above-described choke also reduces the signal impedance to ground, thereby increasing the signal loss.

In addition to the effects on frequency response, the RF chokes used in the equipment of the cable system must be capable of passing several amperes of AC current. The wire used for the coil must therefore be large enough to carry relatively high currents, usually up to 15 amperes in such cable transmission systems, without becoming excessively warm. Unfortunately, the larger the wire size the more troublesome the related parasitic resonance problem becomes. High currents also pose problems in that core materials are likely to approach saturation, thereby presenting the RF signals with an impedance which varies at the frequency rate of the single phase AC power signal. The effect of this is an unwanted modulation of RF signals commonly referred to as "hum mod."

The above described problems related to high AC current can be effectively reduced by careful selection of wire size, core material, core geometry, shunt resistors and winding dimensions. Many RF chokes have been used from give good performance to the 5 MHZ to 450 MHZ frequency range. However, when these chokes are used for the 5 MHZ to 1,000 MHZ frequency range, they exhibit a moderate amount of insertion losses at about 750 MHZ. High attenuation of the signal results when the losses are allowed to cascade over many circuits. It is desirable to maximize the reduction of insertion losses as many chokes are cascaded over large networks. Thus, savings of even the smallest amount of insertion loss manifests into a substantial amount of power savings over a large network.

Cable system capabilities are needed for extended bandwidths and upper frequency limits beyond 750 MHZ to 1 GHz and higher. Therefore, a need exists for an improved RF choke which overcomes the problems and shortcomings associated with the prior art.

SUMMARY OF THE INVENTION

In accordance with the present invention, an improved RF choke is disclosed for use in cable and telephone systems over which RF signals and AC power signals are each transmitted and distributed.

It is an object of this invention to provide an improved RF choke.

Another object of this invention is to separate RF signals from AC power signals on a cable network using a choke having reduced insertion loss as well as reduced hum modulation at radio frequencies of between about 5 MHZ and 1 GHz.

It is a further object of the invention to reduce the insertion loss of an RF choke to save substantial amount of power which is usually lost when circuits incorporating the RF choke are cascaded in a large network.

Generally speaking, the present invention comprises an RF choke that includes an elongated ferromagnetic core, usually but not necessarily composed of ferrite, having first and second end portions which have similar magnetization and saturation characteristics, a first winding which encircles the first end portion in a first direction and has a first predetermined number of turns, and second and third windings which encircle the second end portion in a second, opposite direction and have second and third predetermined numbers of turns, respectively. These three windings are connected in series with one another between a pair of leads that serve to connect them to the external circuitry with which the choke is used.

In accordance with a first important feature of the present invention, the number and spacing of the turns within the first winding are so related to the numbers and spacings of the turns within the second and third windings that relatively low frequency currents, such as AC power currents, generate substantially canceling fluxes in the first and second end portions of the core, while relatively high frequency currents, such as those used to transmit broadband RF signals, do not generate canceling fluxes in the first and second end portions of the core. This allows the choke to present a negligible or at least a relatively low inductance to relatively low frequency currents, while presenting a relatively higher inductance to relatively high frequency currents, thereby enhancing the ability of circuits which include the choke to discriminate between and separate the power and signal bearing components of the currents flowing therethrough.

In preferred embodiments of the present invention, the windings that are associated with the two end portions of the core are separated by a predetermined distance which is selected to enhance the frequency discriminating capabilities which the choke exhibits as a result of the above-mentioned relationships between the numbers and spacings of the turns of the windings. The effect of this separation or spacing between these windings is to alter the degree to which fluxes generated within the end portions of the core cancel one another, particularly at the high end of the range of frequencies over which the choke is designed to operate. In particular, higher separations or spacings have the effect of reducing the amount of flux cancellation which occur at the high end of this range, and thereby increasing the difference between the inductive impedances which the choke presents at high and low frequencies. In embodiments in which the diameters of the first and second end portions are different, this spacing is preferably approximately equal to the diameter of the smaller one of these end portions. In embodiments in which these diameters are the same, this spacing is approximately equal to this diameter.

Since cores of the type used in the present invention will ordinarily be molded under pressure, they will ordinarily have a small taper or draw, i.e., have diameters which vary slightly along the length thereof. In order to avoid repeatedly referring to this diameter variation in the description of the invention which follows, it will be understood that the term "diameter", as used herein, refers to a dimension of the core which is perpendicular to the longitudinal axis thereof and which is selected according to a suitable uniformly applied rule, such as the average diameter, the diameter at the smaller or larger end, etc., and encompasses all cores which comply with that rule, without regard to the magnitude of their taper or to the lack thereof.

The core used in the RF choke of the present invention may have end portions that take a variety of different forms and/or have a variety of different configurations. In a first type of embodiment, for example, the core may comprise a single piece of ferromagnetic material having end portions with substantially similar diameters, or two pieces of ferromagnetic material, referred to herein as core members, with substantially similar diameters that are secured together in end to end relationship with one another, with only a negligibly thin layer of glue disposed therebetween. Cores of this type may, on the other hand, comprise a single piece of magnetic material having end portions with unequal diameters, or two pieces of magnetic material with unequal diameters which are secured together.

In a second type of embodiment, one or both end portions of the core may comprise a core assembly made up of two or more pieces, herein referred to as core segments, which are disposed in end to end relationship with one another. Cores of this type have the advantage that they have the effect of spreading the taper that is associated with the use of molding processes along the length of the core as a whole, and thereby reducing the diameter differences that accumulate along the length thereof. Cores of this type will often be referred to herein as segmented or stacked cores. As in the case of cores which have end portions which are not segmented, cores which have end portions which are segmented may have end portions that have either equal or unequal diameters.

In still another type of embodiment, the end portions of the core may have different compositions, provided that they have similar magnetization and saturation characteristics, together with sizes that permit them to exhibit frequency dependent flux cancellation characteristics of the kind necessary for them to accomplish their purpose. An end section having a relatively large diameter and a relatively low permeability may, for example, be combined with an end section having a relatively small diameter and a relatively high permeability. Embodiments of this type may be implemented in any core having two or more pieces, including any of the core configurations described above.

Other combinations of core numbers, diameters and compositions will be apparent to those skilled in the art. It will be understood that all such combinations are within the contemplation of the present invention.

In addition to having any of the types of cores described above, the choke of the present invention may also have a core in which the two end portions are separated by an air gap which has a predetermine length, or by a non-magnetic spacing element that establishes and maintains a predetermined distance therebetween. The effect of such an air gap or spacer is generally similar to that produced by the above-described separation or spacing between the windings that are associated with the two end portions of the core, namely: to reduce the amount of flux cancellation which occurs at the high end of the range of frequencies over which the choke is used. While either an air gap or a spacing element may produce this effect, a spacing element is preferred because it can serve as a structure to which the two parts of the core may both be glued or otherwise attached, and thereby effectively maintained at the desired distance with a high degree of accuracy. Embodiments of this type may be implemented in any core having two or more pieces, including any of the core configurations described above.

Finally, preferred embodiments of the invention include a plurality of resistors which have the effect of flattening the inductance vs. frequency characteristics of the choke, particularly over parts or bands of its design frequency range where it tends to exhibit resonances. These resistors may be connected either between the leads of the choke and predetermined respective ones of the turns of any of the windings, or between predetermined ones of the turns of the windings themselves. The optimum numbers and connections of these resistors will ordinarily depend on the structure of cores and windings used in the choke, and will therefore be different depending on which of the above described embodiments is used.

Other objects and advantages of the present invention will be apparent from the following description and drawings, in which:

DETAILED DESCRIPTION OF THE PREFERRED EMBODIMENT

Figure 1:
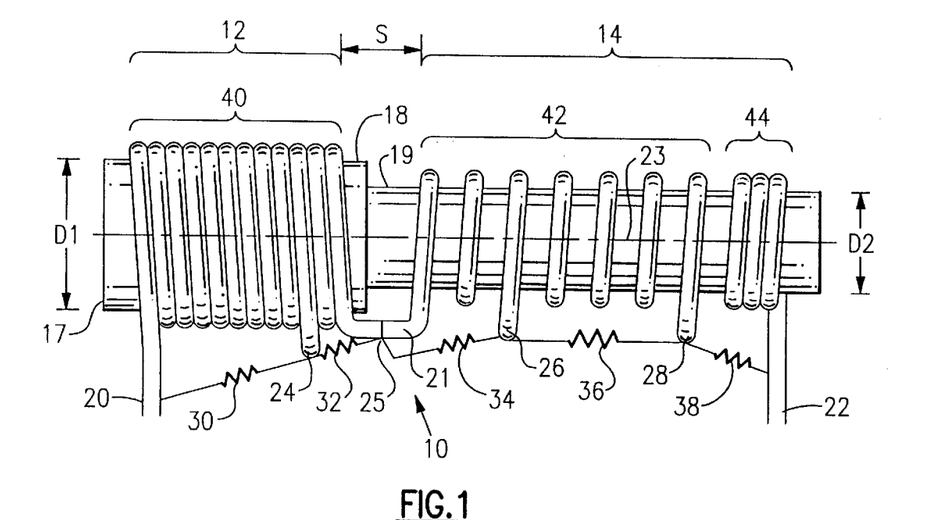
FIG. 1 is a top view of a first embodiment of an RF choke constructed in accordance with the invention which has a two-piece core that includes two cores with unequal diameters.
Figure 2:
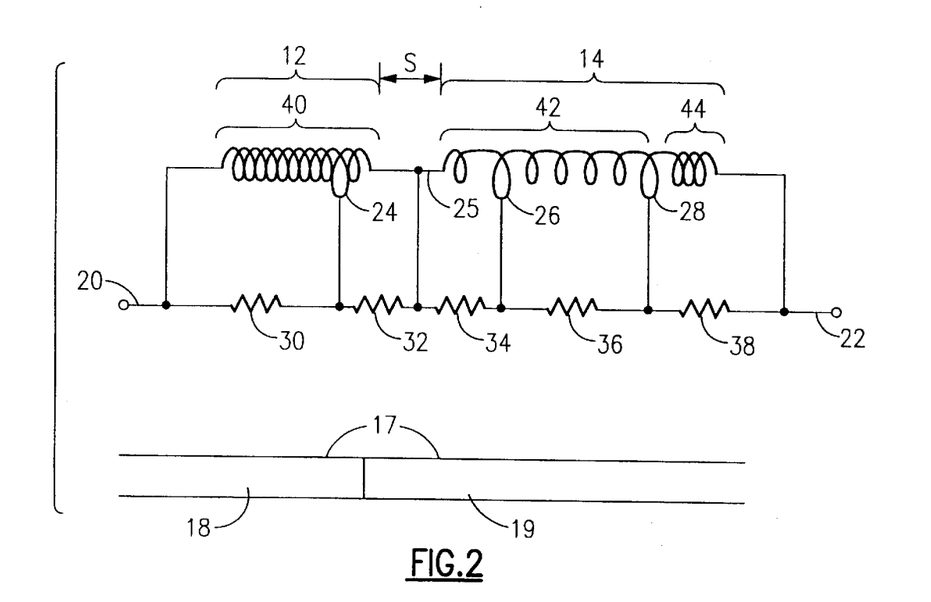
FIG. 2 is a schematic diagram of the RF choke of FIG. 1.

Referring to FIGS. 1 and 2, there is shown a first embodiment of an RF choke 10, having two conductors 12 and 14 wound in series upon a generally cylindrically shaped elongated core 17. The conductors 12 and 14 are of a suitable gauge (preferably a copper and polyurethane insulated 15 AWG wire type, although other wire sizes may be used), having a predetermined thickness. These conductors may, but need not, have the same composition. An unconnected end of conductor 14 will be referred to as input lead 22 and an unconnected end of conductor 12 will be referred to as output lead 20.

The elongated core 17 is preferably composed of a ferromagnetic material, such as ferrite. In the embodiment of FIG. 1, the elongated core 17 has a two-piece structure, and includes first and second core members 18 and 19, respectively, which have different diameters, core member 18 having a larger diameter than core member 19. It is preferable that core members 18 and 19 have magnetization and saturation characteristics which are as nearly the same as possible, e.g., have B-H curves which are substantially similar to one another. The smaller diameter of core member 19 allows for a lower inductance and a lower self-capacitance, which gives an improved performance at higher frequencies. First and second core members 18 and 19 are secured together, usually by glue, to form respective first and second end portions of core 17 as a whole.

Conductor 12 is wound a predetermined number of turns around larger core member 18 and forms a first winding 40. As shown in FIG. 1, the turns of first winding 40 are preferably relatively closely spaced or contiguous with one another. In addition, a preselected turn of the first winding 40 can be a raised turn or loop 24, as illustrated in FIG. 1.

Conductor 14 is connected in series with conductor 12, but is wound around the smaller core member 19 in a direction opposite to that of first winding 40. The turns of conductor 14 form second and third windings 42 and 44, respectively. In the embodiment of FIG. 1, second winding 42 is preferably made up of turns some or all of which are more widely spaced than the turns of first winding 40. The relatively greater spacings of the turns of the second winding are preferred in the embodiment of FIG. 1 because this greater spacing causes the choke to have a better frequency response at higher frequencies. One or more preselected turns of second winding 42 can be a raised turns or loops, such as turns 26 and 28.

Third winding 44 is connected in series with the second winding 42 and is wound around core member 19 in the same direction as second winding 42. In the embodiment of FIG. 1, third winding 44 is preferably made up of turns some or all of which are relatively closely spaced or contiguous with one another. Ordinarily, windings 42 and 44 are distinguishable from one another only by virtue of the fact that the turns thereof have different spacings. The turns of second and third windings 42 and 44 may, therefore, be regarded as parts of a single winding group that is associated with second core member 19 of core 17.

Because the first end portion 18 of elongated core 17 is encircled by a winding 40 that is wound in a first direction, while the second end portion 19 thereof is encircled by second and third windings 42 and 44 which are wound in the opposite direction, current flowing through second and third windings 42 and 44 generates, within core 17, flux which tends to cancel the flux generated therein by current flowing through first winding 40. In accordance with the present invention, the numbers and spacings of the turns of first winding 40 are so related to the numbers and spacings of the turns of second and third windings 42 and 44 that relatively low frequency currents flowing through these windings generate fluxes that cancel one another virtually completely, while relatively high frequency currents flowing through these windings generate fluxes which do not cancel one another. This, in turn, enables the choke of the invention to discriminate between currents on the basis of their frequency, and to be highly effective at separating AC power currents from RF signal currents.

As shown in FIGS. 1 and 2, the last turn of first winding 40 is separated from the first turn of second winding 42 by a predetermined distance S, also referred to herein as a space or winding spacing. The last turn of the first winding is connected in series with the first turn of the second winding by a connecting lead 21 (FIG. 1) that runs parallel with the axis 23 of the core to provide a predetermined axial spacing S between the windings. As the width of space S is increased, the cancellation of flux in core 17 at relatively high frequencies decreases, thereby increasing the inductive impedance presented by the choke at those frequencies. At low frequencies, e.g., that of the AC power current, the size of the space S has no significant effect on the cancellation of flux in core 17 and therefore no significant effect on the inductive impedance presented by the choke at those frequencies. As a result, the inclusion of space S has the effect of increasing the ability of the choke to discriminate between low and high frequency currents.

In preferred embodiments of the invention, a plurality of resistors 30, 32, 34, 36 and 38 having preselected values are connected either between preselected turns of conductors 12 and 14, or between these preselected turns and leads 22 and 20. Resistors such as 30, 32, 34, 36 have the effect of reducing unwanted resonant frequencies. In the embodiment of FIG. 1, resistor 30 is connected between lead 20 and a raised turn 24 of first winding 40. Resistor 32 is connected between raised turn 24 and the beginning of the first turn 25 of second winding 42. Resistor 34 is connected between the beginning of the first turn 25 of second winding 42 and a raised turn 26 of second winding 42. Resistor 36 is connected between raised turns 26 and 28 of second winding 42. Finally, resistor 38 is connected between a raised turn 28 of second winding 42 and lead 22.

As is known, cable transmission and distribution systems have different bandwidths and different AC current carrying capacities, and therefore require chokes having different sizes and configurations. As a result, the resistor values and connections which produce the best overall results will vary from system to system. It will therefore be understood that the resistor connections shown in FIG. 1 are exemplary only, and that the present invention encompasses all resistor values and connections which are compatible with the winding configurations and mode of operation contemplated by the present invention.

In accordance with an important feature of the present invention, it is desirable that the end portions of core 17 have similar magnetization and saturation characteristics. This does not, however, mean that these end portions must have the same composition. On the contrary, they may have different compositions, provided that the diameters and lengths of the core portions using those compositions are selected so that the core portions have similar overall magnetization and saturation characteristics. It will therefore be understood that the present invention contemplates both core portions which have the same composition and core portions which have different compositions.

REPRESENTATIVE SPECIFIC EXAMPLE

There will now be described a specific example of a choke of the type shown in FIG. 1. Core 17 may be made up of a first end portion 18 that has a diameter of approximately 9.6 mm (0.38 inches) and a length of approximately 23.1 mm (0.91 inches), and a second end portion 19 that has a diameter of approximately 8.1 mm (0.32 inches) and a length of approximately 23.1 mm (0.91 inches). These end portions are made of the same ferrite material and have similar magnetization and saturation characteristics.

The first winding 40 includes twelve relatively closely spaced turns, with the eighth turn from lead 20 forming a raised turn or loop 24. The second winding 42 includes seven relatively widely spaced turns, with the third and seventh turns from the junction 25 between the first and second windings forming raised turns 26 and 28. Third winding 44 includes three relatively closely spaced turns.

In the present example, only resistors 30, 34 and 36 are included. Resistor 30 has a value of approximately 750 ohms, and is connected between lead 20 and raised turn 24 of first winding 40. Resistor 34 has a value of approximately 510 ohms, and is connected between the junction 25 of the first and second windings and raised turn 26 of second winding 42. Resistor 36 has a value of approximately 1800 ohms, and is connected between raised turns 26 and 28 of second winding 42.

EXEMPLARY APPLICATION OF THE CHOKE OF THE INVENTION

Figure 3:
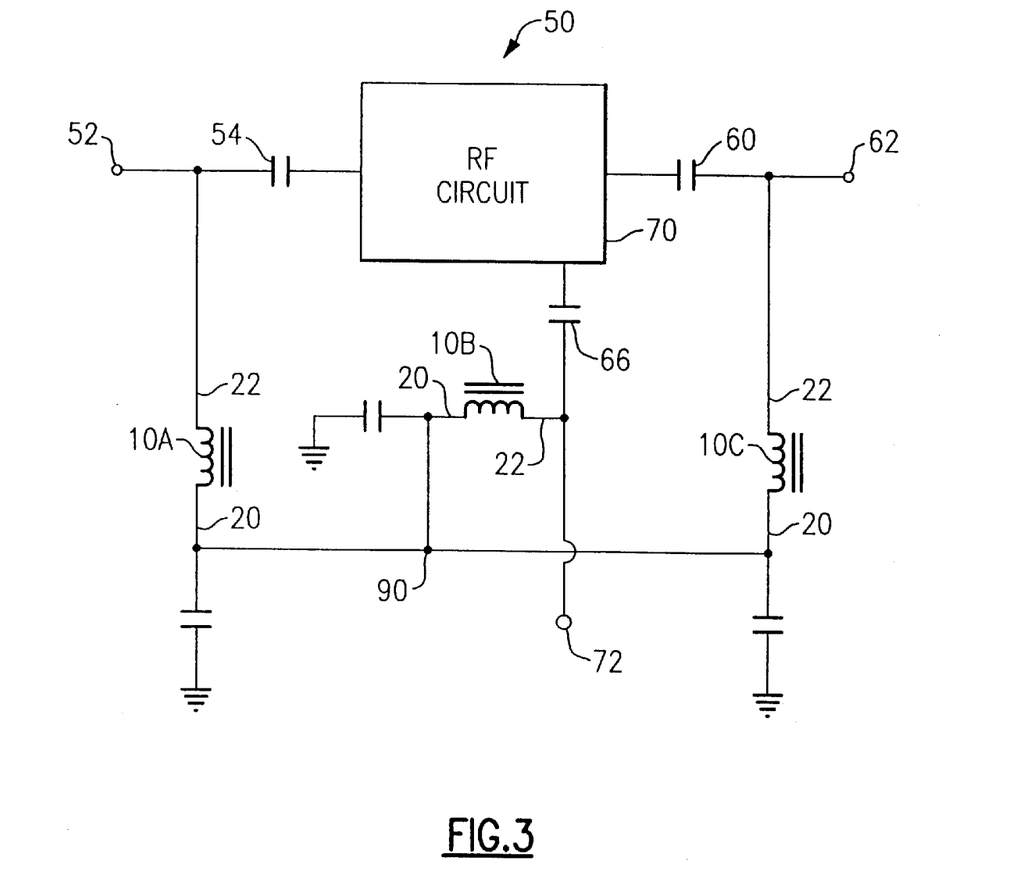
FIG. 3 is a schematic diagram of a line splitter circuit employing the RF chokes of FIGS. 1 and 2.

FIG. 3 illustrates the use of RF choke 10 in a line splitter circuit 50. In a line splitter circuit 50, the RF signal is split so that it passes onto two or more output terminals. In the circuit shown in FIG. 3, input terminal 52 of the line splitter circuit 50 contains both RF signal and AC power signal. The signals are separated at RF chokes 10A, 10B and 10C. All of the AC power signal and virtually none of the RF signal pass through RF choke 10A, 10B and 10C. The RF signal passes across capacitors 54, 60 and 66, while AC power signal is blocked by capacitors 54, 60 and 66.

Still referring to FIG. 3, the line splitter circuit 50 includes one input terminal 52 and two output terminals 62 and 72. As the RF signal and AC power signal each pass through input terminal 52, the RF signal passes through capacitor 54 to an RF circuit 70 where the RF signal is split into two RF signals. After passing through the RF circuit 70 the RF signal passes through capacitors 60 and 66 and onto output terminals 62 and 72. RF chokes 10A, 10B and 10C block the RF signal and force the signal between input terminals 52 to output terminals 62 and 72 in the manner described.

As the RF signal and AC power signal pass through input terminal 52, the AC power signal passes through RF choke 10A and then is split at node 90. The split AC power signal then passes through RF chokes 10B and 10C to output terminals 62 and 72 where it recombines with the RF signal. Capacitors 54, 60 and 66 prevent the AC power from passing into the RF circuit 70.

As can readily be seen, RF circuit 70 can be replaced by many other types of circuits including a line extender amplifier, bridge amplifier, trunk amplifier, line coupler, line equalizer, power inserter, etc. In fact, RF circuit 70 can perform more than one of these functions together. In each of these RF circuits it is important that the AC power signal and RF signal be separated so that the RF circuit can process the RF signal.

Alternately, the circuit 50 of FIG. 3 can be easily modified by changing the number of output terminals. For example, an additional output terminal could be added to line splitter circuit 50 to have a three way splitter.

ALTERNATIVE EMBODIMENTS

Figure 4:
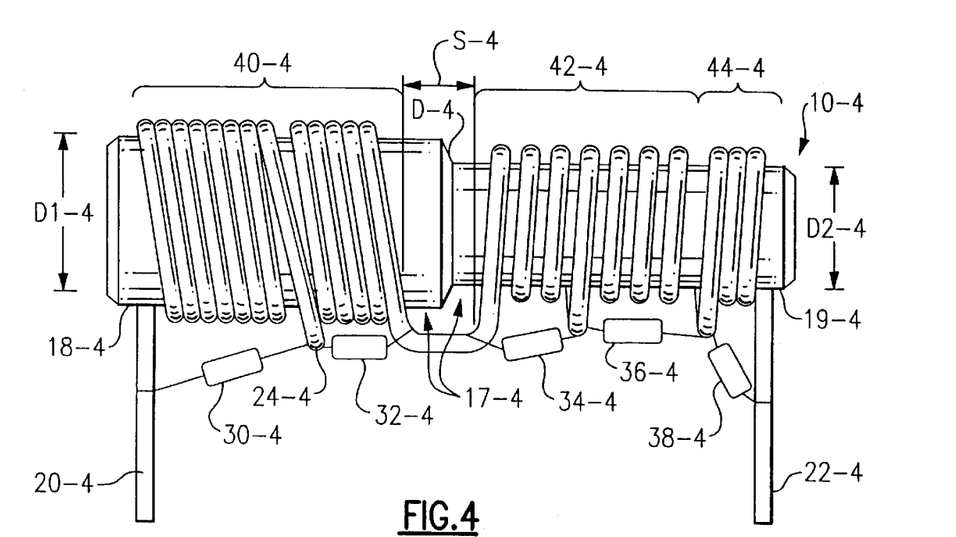
FIG. 4 is a top view of a second embodiment of the RF choke of the invention which has a single-piece core that includes two end portions with unequal diameters.
Figure 5:
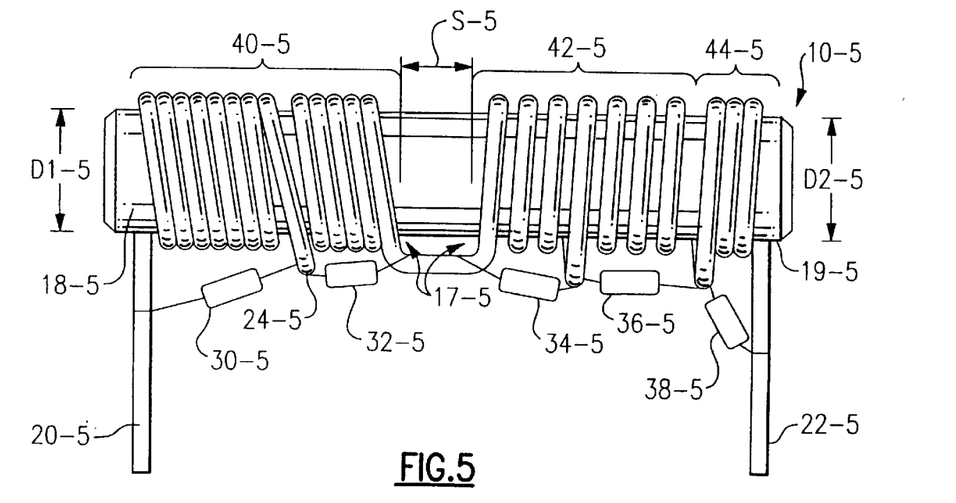
FIG. 5 is a top view of a third embodiment of the RF choke of the invention which has a single-piece core that includes two end portions with equal diameters.

Referring to FIGS. 4 and 5, there are shown respective second and third alternative embodiments of RF chokes which have been constructed in accordance with the present invention. These embodiments are similar to that shown in FIG. 1, similarly functioning parts being similarly numbered, except for the addition of a postscript that corresponds to the number of the Figure in which they appear.

The embodiment of FIG. 4 differs from that of FIG. 1 substantially only in that the core 17-4 of the embodiment of FIG. 4 is a single-piece core, i.e., has first and second end portions 18-4 and 19-4, respectively, which are integral with one another and which are molded at the same time. Because of this single-piece construction, the embodiment of FIG. 4 does not include even a thin layer of glue between end portions 18-4 and 19-4. Because both portions are molded at the same time, however, the part of core 17-4 which lies at the transition between these regions may be provided with a slight taper or draw, labeled D-4 in FIG. 4, in order to facilitate the molding process. Since these differences are relatively minor, they have no significant effect on the operational characteristics of the choke. As a result, the description of the embodiment of FIG. 1 is equally applicable to the embodiment of FIG. 4 and will not be repeated in connection therewith.

The embodiment of FIG. 5 differs from that of FIG. 1 not only in that the embodiment of FIG. 5 includes a single-piece core, but also in that the end portions 18-5 and 19-5 of the embodiment of FIG. 5 have diameters D1-5 and D2-5, respectively, which are approximately equal to one another. Because of the approximate equality of these two diameters, the flux densities in one or both of the end portions of core 17-5 of FIG. 5 will be different from those in the corresponding end portions of the cores of the embodiments of FIGS. 1 and 4. These differences can, however, be dealt with by increasing or decreasing the numbers of turns included in the first, second and third windings thereof as necessary to assure that the flux cancellation relationships described in connection with the embodiment of FIG. 1 are maintained. The approximate equality of these two diameters may also require that winding spacing S-5 of the embodiment of FIG. 5 be made somewhat larger or smaller than that of the embodiment of FIG. 1. Since, except for the last-mentioned differences, the operation of the embodiment of FIG. 5 is similar to that of the embodiment of FIG. 1, the embodiment of FIG. 5 will not be further described herein.

Figure 6:
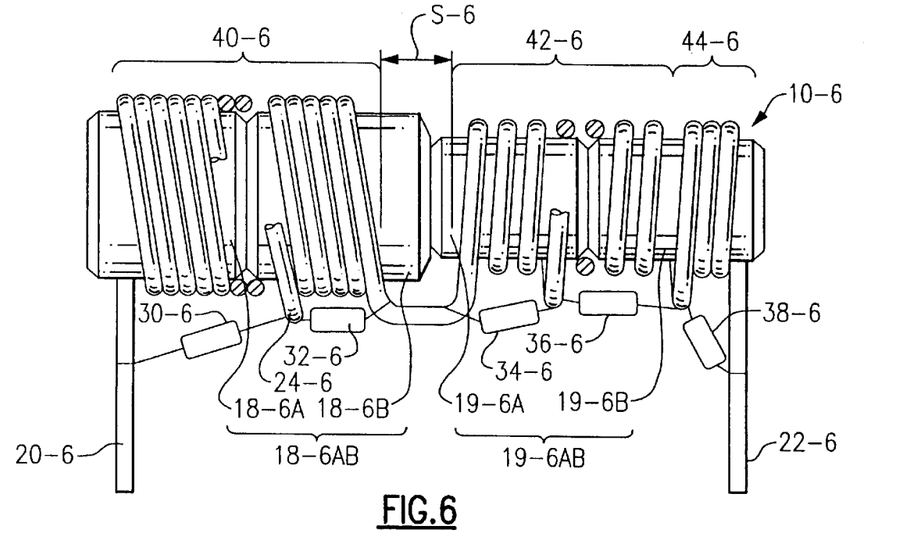
FIG. 6 is a top view of a fourth embodiment of the RF choke of the invention which has a core assembly that includes two component core assemblies, having unequal diameters, which each comprise two core segments that have the same diameter.
Figure 7:
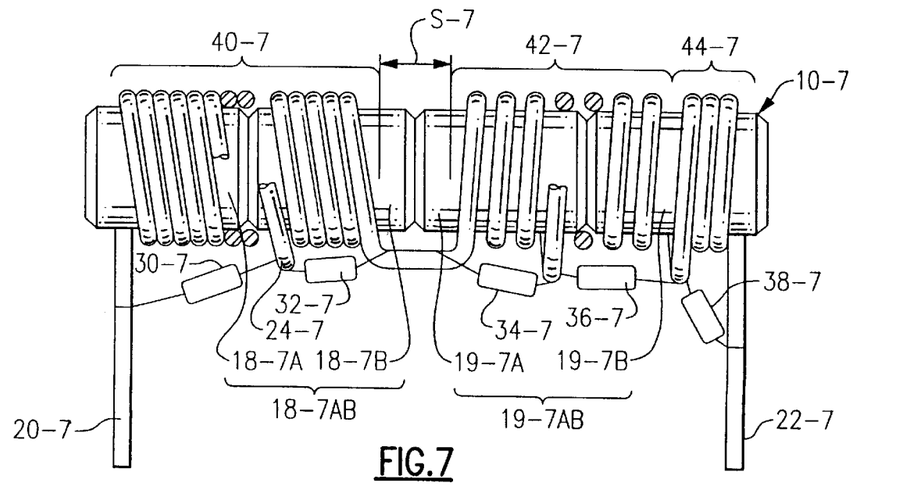
FIG. 7 is a top view of a fifth embodiment of the RF choke of the invention which has a core assembly that includes two component core assemblies, having equal diameters, which each comprise two core segments that have the same diameter.

Referring to FIGS. 6 and 7, there are shown respective fourth and fifth alternative embodiments of RF chokes which have been constructed in accordance with the present invention. These embodiments are similar to those shown in FIGS. 4 and 5, respectively, similarly functioning parts being similarly numbered, except for the addition of postscripts that correspond to the number of the Figure in which they appear, and that reflect elements which have changed structures.

The embodiment of FIG. 6 differs from that of FIG. 4 in that the first and second end portions of core 17-6 of the embodiment of FIG. 6 take the form of first and second component core assemblies 18-6AB and 19-6AB, each of which includes two or more core segments which are disposed in end to end relationship with one another. First component core assembly 18-6AB, for example, includes two substantially similar core segments 18-6A and 18-6B, although it might advantageously include more than two for some applications. Similarly, second component core assembly 19-6AB includes two substantially similar core segments 19-6A and 19-6B. All of these cores segments are preferably secured to one another by means of a suitable glue. The advantage of the embodiment of FIG. 6 is that it causes the taper which is associated with the molding of ferrite cores to be distributed along the length of core 17, and thereby causes the core as a whole to have a more nearly uniform cross-section as a function of its length. Since the operation of the embodiment of FIG. 6 is in other respects similar to those of FIGS. 1, 4 and 5, the embodiment of FIG. 6 will not be described in detail herein.

The embodiment of FIG. 7 is similar to that of FIG. 6, except that the end sections 18-7AB and 19-7AB thereof comprise component core assemblies which have equal rather than unequal diameters. The embodiment of FIG. 7 is also similar to that of FIG. 5, except that it includes a core that it is a multi-rather than a single-piece core. In view of these similarities to previously discussed embodiments, the embodiment of FIG. 7 will not be further discussed herein.

Figure 8:
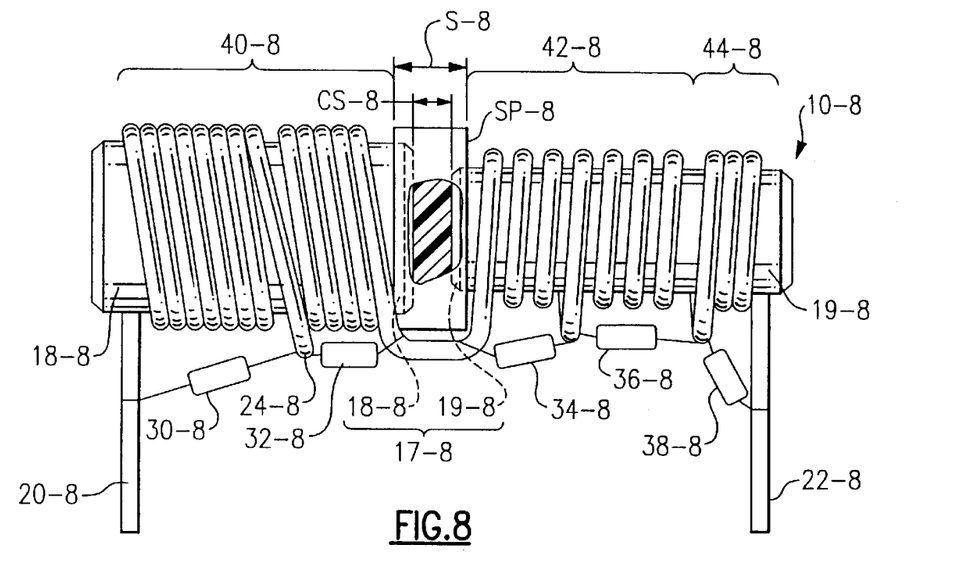
FIG. 8 is a top view of a sixth embodiment of the RF choke of the invention which has a two-piece core that includes end portions which have unequal diameters, and which are separated by a non-magnetic spacer.
Figure 9:
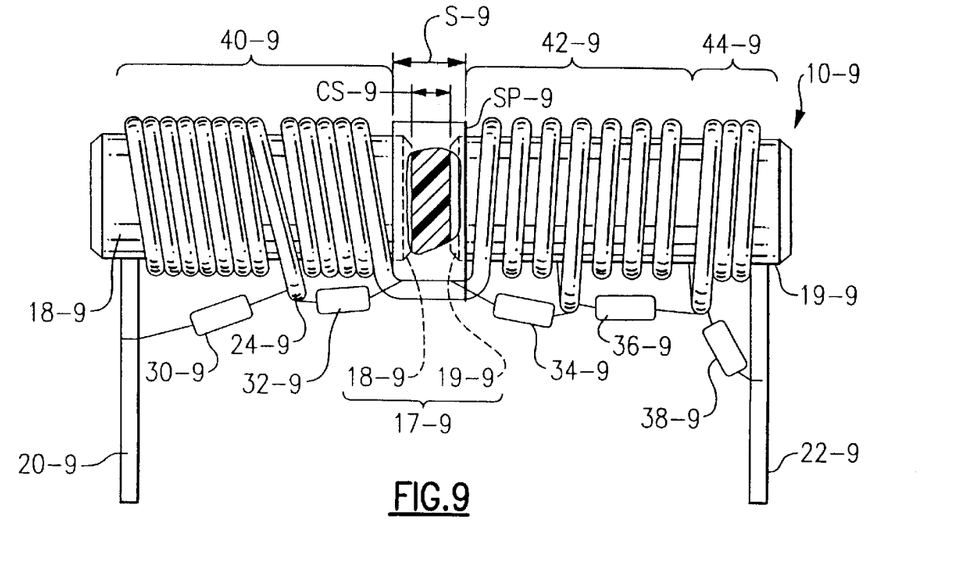
FIG. 9 is a top view of a seventh embodiment of the RF choke of the invention which has a two-piece core that includes end portions which have equal diameters, and which are separated by a non-magnetic spacer.

Referring to FIGS. 8 and 9, there are shown respective sixth and seventh alternative embodiments of RF chokes which have been constructed in accordance with the present invention. These embodiments are similar to those shown in FIGS. 4 and 5, respectively, similarly functioning parts being similarly numbered, except for the addition of postscripts that correspond to the number of the Figure in which they appear, and that reflect elements which have changed structures.

The embodiment of FIG. 8 differs from that of FIG. 4 in that the embodiment of FIG. 8 includes a core 17-8 having two separate core members 18-8 and 19-8 which are spaced apart from one another by a predetermined distance CS-8, also referred to herein as a core spacing. In the preferred embodiment, the space between core members 18-8 and 18-9 is occupied by a spacing element SP-8 which is composed of a non-magnetic material such as plastic, and to which both core members are secured by gluing. This spacing element has been found to have no significant effect on the ability of low frequency currents to generate canceling fluxes within the two portions of core 17-8, but to decrease the ability of high frequency currents to generate canceling fluxes therein. As a result, spacing element SP-8 improves the ability of the choke of the invention to discriminate between AC power current frequencies and RF signal current frequencies. This improvement in frequency discriminating capability is in addition to that resulting from the presence of winding spacing S-8 and, together with the latter, provides significant advantages over chokes known to the prior art.

While embodiments which include a non-magnetic spacer such as SP-8 are preferred, the advantages of introducing a predetermined separation CS-8 between the two end sections of the core can be realized even if an air gap is used in place of spacer SP-8. The use of such an air gap is possible because the permeability of air is approximately the same as that of most plastics. The disadvantage of using an air gap instead of a spacing element is that an air gap is more difficult to establish with the desired accuracy and repeatability, and cannot serve as a structural bridge to which the cores are secured.

The embodiment of FIG. 9 is similar to that of FIG. 8, except that the embodiment of FIG. 9 includes core members that have equal rather unequal diameters. Except for the effect of the above described spacer or air gap, the embodiments of FIGS. 8 and 9 operate in the manner described earlier in connection with the embodiments of FIGS. 1, 4 and 5 and will not, therefore, not be described in detail herein.

Figure 10:
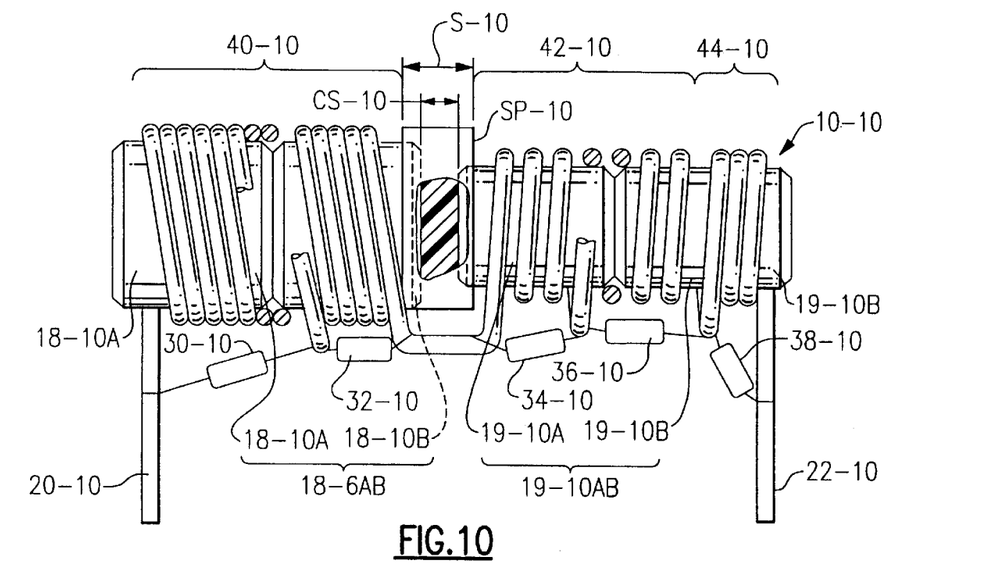
FIG. 10 is a top view of an eighth embodiment of the RF choke of the invention which has a core assembly that includes two component core assemblies, having unequal diameters, that each comprise two core segments which have the same diameter, and that are separated by a non-magnetic spacer.
Figure 11:
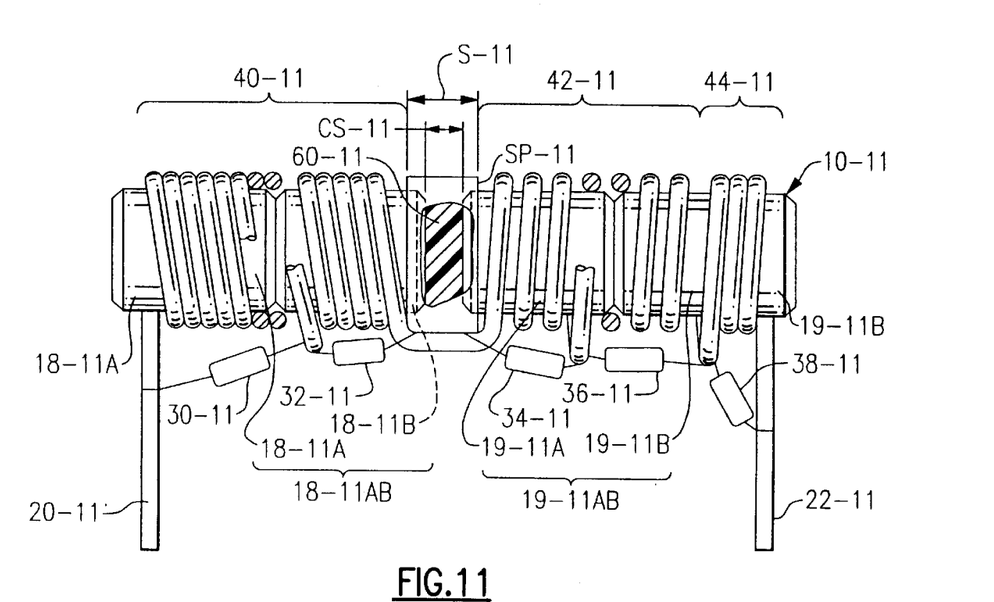
FIG. 11 is a top view of a ninth embodiment of the RF choke of the invention which has a core assembly that includes two component core assemblies, having equal diameters, that each comprise two core segments which have the same diameter, and that are separated by a non-magnetic spacer.

Referring to FIGS. 10 and 11, there are shown respective eighth and ninth alternative embodiments of RF chokes which have been constructed in accordance with the present invention. These embodiments are similar to those shown and described in FIGS. 6 and 7, respectively, similarly functioning parts being similarly numbered, except for the addition of postscripts that correspond to the number of the Figure in which they appear, and that reflect elements which have changed structures.

The embodiment of FIG. 10 is like that of FIG. 6 in that both embodiments include first and second component core assemblies which are made up of substantially similar core segments. The embodiment of FIG. 10 differs from that FIG. 6, however, in that the component core assemblies 18-10AB and 19-10AB of the embodiment of FIG. 10 are separated by a spacer SP-10 of the type described in connection with the embodiment of FIG. 8. Stated differently, the embodiment of FIG. 10 represents an embodiment of the choke of the invention which combines the features of the embodiments of FIGS. 6 and 8.

The embodiment of FIG. 11 is similar to that of FIG. 10, except that the embodiment of FIG. 11 includes component core assemblies that have equal rather unequal diameters. Since the novel features that are combined in the embodiments of FIGS. 10 and 11 have already been described separately in connection with the embodiments of FIGS. 6 and 7 and 8 and 9, the operation of the embodiments of FIGS. 10 and 11 will not be further discussed herein. In this embodiment of the invention the spacer SP11 is provided with an air gap 60-11.

While the present invention has been particularly shown and described with reference to the embodiments illustrated in the drawings, it will be understood that the true spirit as scope of the present invention should be determined with reference to the following claims.

What is claimed is:

1. An RF choke, comprising:
   an elongated ferromagnetic core assembly having a first core member and a second core member aligned along the axis of said core, said first and second core members having generally circular cross-sections of different, predetermined diameters, said first and second core members having substantially the same magnetization and saturation characteristics, and being disposed in end to end relationship with one another;
   a first winding encircling said first core member in a first direction, said first winding including a first predetermined number of turns;
   second and third windings encircling said second core member in a second direction, said second and third windings including second and third predetermined numbers of turns, respectively;
   a pair of leads for connecting said windings to an external device; and
   means for connecting said first, second and third windings in series with one another between said leads, said means further including a connecting lead that is generally parallel with the axis of the core for connecting the first and second windings so that said first and second windings are separated axially by a predetermined distance, said predetermined distance being approximately equal to the diameter of the smaller one of said different diameters;
   wherein the numbers and spacings of the turns within said first winding are so related to the numbers and spacings of the turns within said second and third windings and to said predetermined distance that relatively low frequency currents flowing through said windings generate substantially canceling fluxes in said first and second cores, while relatively high frequency currents flowing through said windings do not generate substantially canceling fluxes in said first and second cores.

2. The choke of claim 1 further including a plurality of resistors, and means for connecting said resistors to predetermined respective ones of the turns of said first, second and third windings.

3. The choke of claim 2 in which said first and second core members are separated by an air gap having a predetermined length.

4. The choke of claim 2 further including a non-magnetic spacer disposed between said first and second core members to establish a predetermined spacing therebetween.

5. The choke of claim 1 in which said first and second core members are separated by an air gap having a predetermined length.

6. The choke of claim 1 further including a non-magnetic spacer disposed between said first and second core members to establish a predetermined spacing therebetween.

7. An RF choke that includes
   an elongated ferromagnetic core having a first end portion and a second end portion, said end portions being aligned along a common axis, having generally circular cross-sections of different, predetermined diameters, and having substantially the same magnetization and saturation characteristics,
   a first winding encircling the first end portion in a first direction, said first winding having first predetermined number of turns,
   second and third windings encircling said second end portion in a second direction, said second and third windings including second and third predetermined number of turns, respectively,
   a pair of leads for connecting said winding to an external device, and
   means for connecting said first, second and third windings in series with one another, and includes a connecting lead that is generally parallel with said axis of the core for connecting the first and second windings so that said first and second windings are separated by a given axial distance, said predetermined axial distance being approximately equal to the diameter of the smaller one of said different diameters,
   wherein the numbers and spacings of turns within said first windings are so related to the numbers and spacings of the turns within the second and third windings and to said given axial distance, that relatively low frequency currents flowing through the windings generate substantially canceling fluxes in the first and second end portions of the core while relatively high frequency currents flowing through said windings do not generate substantially canceling fluxes in the first and second end portions of said core.

8. The RF choke of claim 7 wherein said first and second core end portions each contain one or more core segments that are disposed axially in magnetic series with one another and each segment having substantially the same magnetization and saturation characteristics.

9. An RF choke, comprising:
   an elongated ferromagnetic core having a first end portion and a second end portion, said first and second end portions having generally circular cross-sections, said circular cross-sections having unequal diameters, said core portions having substantially the same magnetization and saturation characteristics;
   a first winding encircling said first end portion in a first direction, said first winding including a first predetermined number of turns;

second and third windings encircling said second end portion in a second direction, said second and third windings including second and third predetermined numbers of turns, respectively;

a pair of leads for connecting said windings to an external device; and means for connecting said first, second and third windings in series with one another between said leads;

said first winding and said second winding being separated by a predetermined distance, said predetermined distance being approximately equal to the diameter of the smaller one of said unequal diameters;

wherein the numbers and spacings of the turns within said first winding are so related to the numbers and spacings of the turns within said second and third windings and to said predetermined distance that relatively low frequency currents flowing through said windings generate substantially canceling fluxes in the first and second end portions of said core, while relatively high frequency currents flowing through said windings do not generate substantially canceling fluxes in the first and second end portions of said core.

10. The choke of claim 9 further including a plurality of resistors, and means for connecting said resistors to predetermined respective ones of the turns of said first, second and third windings.

11. The choke of claim 9 in which said first and second end portions comprise opposite ends of a single piece of ferromagnetic material.

12. The choke of claim 9 in which said first and second end portions comprise respective first and second core members which are disposed in end to end relationship with one another.

13. The choke of claim 12 in which said first and second core members are separated by an air gap having a predetermined length.

14. The choke of claim 12 further including a nonmagnetic spacer disposed between said first and second core members to establish a predetermined spacing therebetween.

15. An RF choke, comprising:

an elongated ferromagnetic core assembly including:

(i) a first component core assembly including one or more first core segments which are disposed in end to end relationship with one another;

(ii) a second component core assembly including one or more second core segments which are disposed in end to end relationship with one another;

(iii) the core segments of said first and second component core assemblies having generally circular cross-sections of different diameters being disposed in magnetic series with one another, and having substantially the same magnetization and saturation characteristics;

a first winding encircling said first component core assembly in a first direction, said first winding including a first predetermined number of turns;

second and third windings encircling said second component core assembly in a second direction, said second and third windings including second and third predetermined numbers of turns, respectively;

a pair of leads for connecting said windings to an external device; and means for connecting said first, second and third windings in series with one another between said leads;

said first winding and said second winding being separated by a predetermined distance, said predetermined distance being approximately equal to the diameter of the smaller one of said different diameters;

wherein the numbers and spacings of the turns within said first winding are so related to the numbers and spacings of the turns within said second and third windings that relatively low frequency currents flowing through said windings generate substantially canceling fluxes in said first and second core assemblies, while relatively high frequency currents flowing through said windings do not generate substantially canceling fluxes in said first and second core assemblies.

16. The choke of claim 15 further including a plurality of resistors, and means for connecting said resistors to predetermined respective ones of the turns of said first, second and third windings.

17. The choke of claim 16 in which said first and second component core assemblies are separated by an air gap having a predetermined length.

18. The choke of claim 16 further including a nonmagnetic spacer disposed between said first and second component core assemblies to establish a predetermined spacing therebetween.

19. The choke of claim 15 in which said first and second component core assemblies are separated by an air gap having a predetermined length.

20. The choke of claim 15 further including a nonmagnetic spacer disposed between said first and second component core assemblies to establish a predetermined spacing therebetween.

* * * * *